(12) United States Patent
Kraft et al.

(10) Patent No.: US 11,894,805 B2
(45) Date of Patent: Feb. 6, 2024

(54) DEVICE FOR REDUCING THE OPEN CIRCUIT VOLTAGE OF A SOLAR SYSTEM

(71) Applicant: Enphase Energy, Inc., Petaluma, CA (US)

(72) Inventors: Steven M. Kraft, Albany, CA (US); Kevin Fischer, Orinda, CA (US); Greg Beardsworth, San Francisco, CA (US); Zachary S. Judkins, Oakland, CA (US); Keith Johnston, Calgary (CA)

(73) Assignee: Enphase Energy, Inc., Petaluma, CA (US)

( * ) Notice: Subject to any disclaimer, the term of this patent is extended or adjusted under 35 U.S.C. 154(b) by 349 days.

(21) Appl. No.: 15/289,038

(22) Filed: Oct. 7, 2016

(65) Prior Publication Data

US 2017/0025995 A1 Jan. 26, 2017

Related U.S. Application Data

(63) Continuation of application No. 13/217,749, filed on Aug. 25, 2011, now Pat. No. 9,472,691.

(51) Int. Cl.
| | |
|---|---|
| *H02S 40/34* | (2014.01) |
| *H01L 31/02* | (2006.01) |
| *G05F 1/618* | (2006.01) |
| *G05F 3/26* | (2006.01) |
| *H02J 1/08* | (2006.01) |

(52) U.S. Cl.
CPC .............. *H02S 40/34* (2014.12); *G05F 1/618* (2013.01); *G05F 3/26* (2013.01); *H01L 31/02021* (2013.01); *H02J 1/08* (2013.01); *Y02E 10/50* (2013.01)

(58) Field of Classification Search
CPC . H02S 40/34; G05F 1/618; G05F 3/26; H01L 31/02021
USPC .................................................. 136/242–265
See application file for complete search history.

(56) References Cited

U.S. PATENT DOCUMENTS

| | | | |
|---|---|---|---|
| 6,051,954 A | 4/2000 | Nagao et al. | |
| 2002/0118559 A1 | 8/2002 | Kurokami | |
| 2008/0150366 A1 | 6/2008 | Adest et al. | |
| 2009/0273241 A1 | 11/2009 | Gazit et al. | |
| 2009/0284232 A1* | 11/2009 | Zhang | H02J 3/385 322/89 |
| 2010/0019580 A1 | 1/2010 | Croft et al. | |
| 2011/0025130 A1* | 2/2011 | Hadar | H01L 31/02021 307/80 |
| 2011/0084553 A1 | 4/2011 | Adest et al. | |
| 2011/0173276 A1 | 7/2011 | Elzips et al. | |
| 2012/0325283 A1 | 12/2012 | Robbins | |

* cited by examiner

*Primary Examiner* — Kourtney R S Carlson
(74) *Attorney, Agent, or Firm* — Moser Taboada

(57) ABSTRACT

Devices for reducing the open circuit voltages of solar systems are described. In one embodiment, a solar system includes a string of a plurality of solar modules having an open circuit voltage. The solar system also includes a device for reducing the open circuit voltage of the string of the plurality of solar modules during an open circuit configuration.

12 Claims, 4 Drawing Sheets

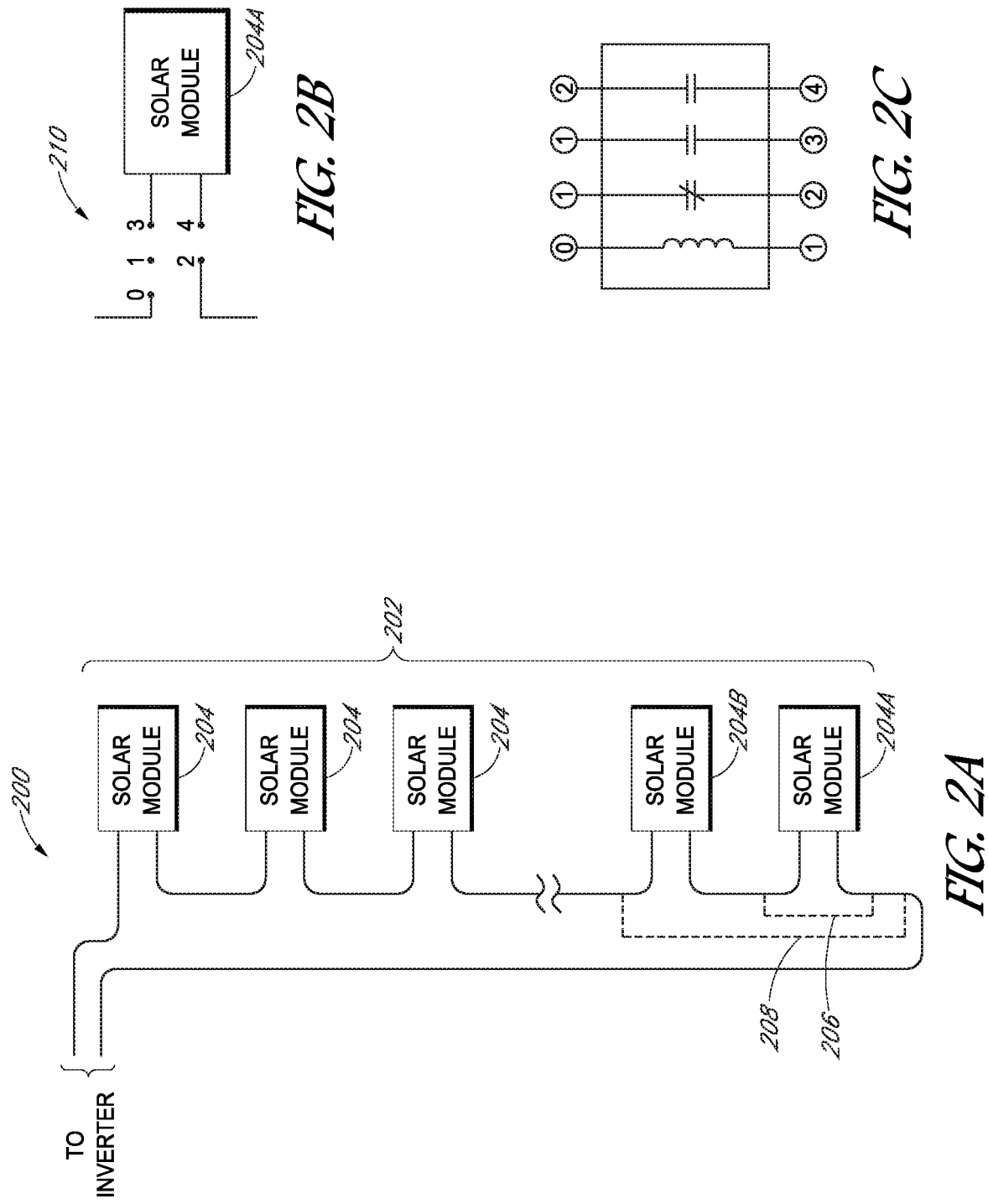

DEVICE FOR REDUCING THE OPEN CIRCUIT VOLTAGE OF A SOLAR SYSTEM

CROSS-REFERENCE TO RELATED APPLICATIONS

This application is a continuation of U.S. patent application Ser. No. 13/217,749, filed on Aug. 25, 2011, the entire contents of which are hereby incorporated by reference herein

TECHNICAL FIELD

Embodiments of the present invention are in the field of renewable energy and, in particular, devices for reducing the open circuit voltages of solar systems.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto. A plurality of photovoltaic cells may be included in a solar module. A string of several to many solar modules may make up a solar system.

Balance-of-system (BOS) in a solar system typically includes everything except the solar modules themselves. BOS costs can be reduced by making strings of solar modules longer. Currently, string length is limited by the string open circuit voltage. Since the operating voltage (e.g., mpp voltage or maximum power point voltage) is well below the open circuit voltage, this forces strings when normally operating to operate with significant voltage headroom. As an example, a system having an open circuit voltage (Voc) of 85.3 and an operating voltage (Vmpp) of 72.9 rated for 1000 Volts allows use of 11 panels in a string in a system where the coldest temperature is 25 degrees Celsius. This results in a system that operates at 802 Volts, or about 200 Volts below the voltage rating of the system.

BRIEF DESCRIPTION OF THE DRAWINGS

FIG. 2A illustrates a portion of a solar system, in accordance with an embodiment of the present invention.

FIG. 2B illustrates an exemplary arrangement of points where current may be measured and decoupling/coupling may take place, in accordance with an embodiment of the present invention.

FIG. 2C illustrates a relay having a normally closed contact and two normally open contacts, in accordance with an embodiment of the present invention.

DETAILED DESCRIPTION

Figure 1C:
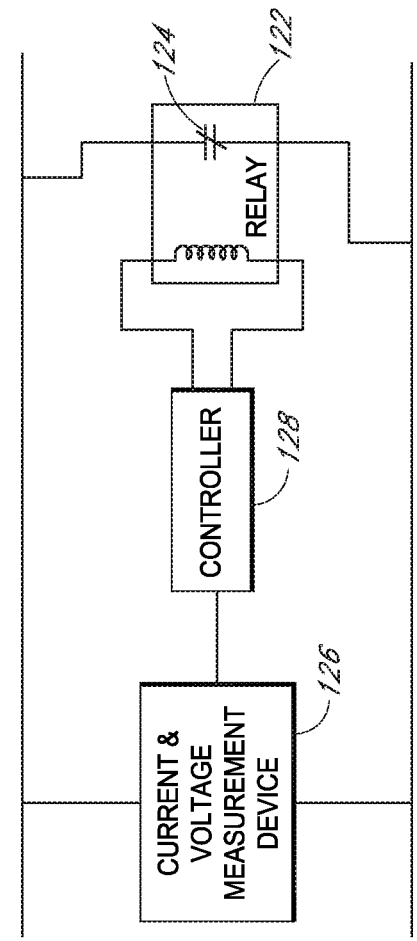
FIG. 1C illustrates a current shunting device suitable for reducing an open circuit voltage of a string of a plurality of solar modules in response to a measured voltage, in accordance with an embodiment of the present invention.

Devices for reducing the open circuit voltages of solar systems are described herein. In the following description, numerous specific details are set forth, such as specific current shunting devices or switching circuitry, in order to provide a thorough understanding of embodiments of the present invention. It will be apparent to one skilled in the art that embodiments of the present invention may be practiced without these specific details. In other instances, well-known fabrication techniques, such as solar panel or solar module fabrication techniques, are not described in detail in order to not unnecessarily obscure embodiments of the present invention. Furthermore, it is to be understood that the various embodiments shown in the figures are illustrative representations and are not necessarily drawn to scale.

Voltage generated by a solar module is typically higher in an open condition versus an operating condition. The modules are arranged as a string of modules in series. Governing voltage regulations typically call for requirements dictated by the open circuit voltage. As described above, for a 1000V system, such a regulation may result in a system that operates at, e.g., 802 Volts, or about 200 Volts below the voltage rating of the system. As such, it may be beneficial if the rating of a solar system is not limited or dictated by the open circuit voltage of a string of modules associated with the system.

In accordance with an embodiment of the present invention, one or more solar modules are effectively removed from the circuit including a string of solar modules when the string of modules is in an open circuit configuration. In another embodiment, a device is provided for shunting current in a location of a solar system suitable to prevent an open circuit from occurring. For example, in one embodiment, current is shunted from PV circuits of a solar system when conditions near the open circuit voltage are detected. Approaches described herein may allow strings of panels or modules to be designed that include more panels or modules than otherwise typically permitted based on a calculated open circuit voltage. As a result, lower balance-of-system costs may be realized, e.g., a reduced number of inverters required per total number of solar modules in a solar system.

In an embodiment, a voltage in a string of solar modules is dropped either by removing a module from the string or by shunting the current somewhere. As such, in an exemplary embodiment, a solar system includes a string of a plurality of solar modules having an open circuit voltage. The solar system also includes a device for reducing the open circuit voltage of the string of the plurality of solar modules during an open circuit configuration. In a specific such embodiment, an exemplary string of solar modules has an open circuit voltage of approximately 1000 Volts. The included device reduces the open circuit voltage by an amount approximately in the range of 150-200 Volts during the open circuit configuration. In another embodiment, the device reduces the open circuit voltage by an amount of at least 5% of the open circuit configuration. Embodiments of the present invention may rely on either measured string current or measured string voltage to determine whether to perform its function.

Disclosed herein are devices for reducing the open circuit voltages of solar systems. In one embodiment, a solar system includes a string of a plurality of solar modules and a current shunting device electrically coupled to the string of the plurality of solar modules. In one embodiment, a solar system includes a string of a plurality of solar modules and a device for electrically decoupling a solar module from the string of the plurality of solar modules during an open circuit configuration.

In an aspect of the invention, a device for reducing the open circuit voltage of the string of the plurality of solar modules during an open circuit configuration is a current shunting device electrically coupled to the string of the plurality of solar modules. In an embodiment, the device is installed at the string level, at the combiner box level, or at the inverter level. The voltage of the PV circuit in question is measured and, in response, the PV circuit is shunted across a dissipative load when the PV circuit is near to its open circuit condition. As an example, FIG. 1A illustrates a portion of a solar system with a device for limiting the voltage of a string of modules in the open circuit condition, in accordance with an embodiment of the present invention.

Figure 1B:
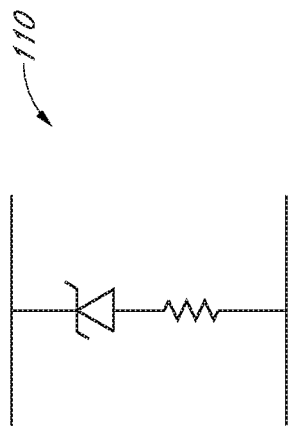
FIG. 1B illustrates a zener diode suitable for reducing an open circuit voltage of a string of a plurality of solar modules in response to a measured voltage, in accordance with an embodiment of the present invention.
Figure 1A:
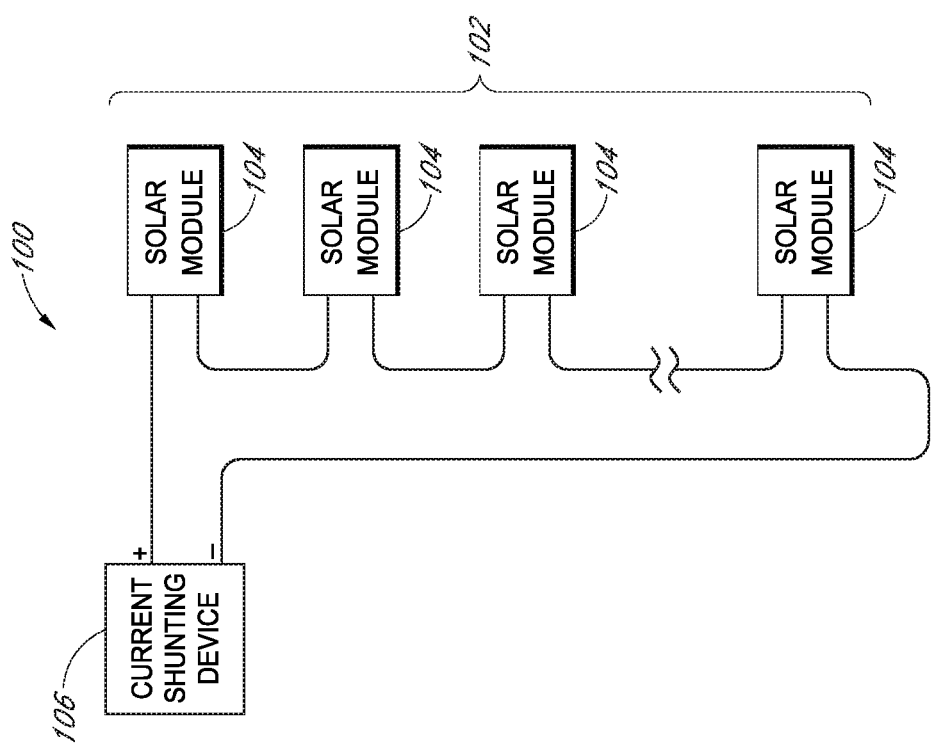
FIG. 1A illustrates a portion of a solar system with a device for limiting the voltage of a string of modules in the open circuit condition, in accordance with an embodiment of the present invention.

Referring to FIG. 1A, a portion of a solar system 100 includes a string 102 of a plurality of solar modules 104. A current shunting device 106 is electrically coupled to the string 102 of the plurality of solar modules 104. In an embodiment, the current shunting device 106 is used to limit the voltage of the string 102 in open circuit conditions.

In an embodiment, the current shunting device 106 is included in the string 102 of the plurality of solar modules 104, an exemplary general depiction of which is shown in FIG. 1A. However, in another embodiment, the solar system further includes a combiner box assembly electrically coupled to the string 102 of the plurality of solar modules 104, and the current shunting device 106 is housed in the combiner box assembly. In another embodiment, the solar system further includes an inverter assembly electrically coupled to the string 102 of the plurality of solar modules 104, and the current shunting device 106 is housed in the inverter assembly. In an embodiment, the current shunting device 106 is for reducing the open circuit voltage of the string 102 of the plurality of solar modules 104 in response to a measured voltage.

Devices for shunting the current of a string of modules in an open circuit configuration may range from basic to sophisticated. As a relatively basic example, FIG. 1B illustrates a zener diode 110 suitable for reducing the open circuit voltage of the string 102 of the plurality of solar modules 104 in response to a measured voltage, in accordance with an embodiment of the present invention. In one such embodiment, the breakdown voltage of the zener diode 110 is set to prevent the PV circuit voltage from exceeding the desired maximum voltage. The zener diode 110 may be used to perform both a voltage measurement function and a switching function for current shunting.

As a relatively more sophisticated example, FIG. 1C illustrates a current shunting device 120 suitable for reducing the open circuit voltage of the string 102 of the plurality of solar modules 104 in response to a measured voltage (i.e., for use as current shunting device 106 of FIG. 1A), in accordance with an embodiment of the present invention. Current shunting device 120 includes a relay 122 with a normally closed contact 124 to normally shunt a PV string. If the PV string is providing power, and also if the measured voltage by current and voltage measurement device 126 is less than the desired maximum voltage, then the controller 128 will open the relay, removing the shunt path for the string. The removal of the shunt path allows the PV circuit to send DC power to a real system load. If the power is removed, however, or if the system voltage exceeds the maximum desired voltage, the relay contact 124 is closed, and the PV circuit is shunted.

It is to be understood that current shunting device 106 may be any suitable device configured to reduce an open circuit voltage in response to a measured voltage. In an embodiment, the current shunting device 106 is a device such as, but not limited to, a zener diode (see, e.g., FIG. 1B), a transistor, or an electric switch (see, e.g., FIG. 1C).

In an aspect of the invention, a device for reducing the open circuit voltage of the string of the plurality of solar modules during an open circuit configuration is a device for electrically decoupling a solar module from the string of the plurality of solar modules during an open circuit configuration. In an embodiment, switching circuitry is designed to electrically remove a module from a string based on string current. As an example, FIG. 2A illustrates a portion of a solar system, in accordance with an embodiment of the present invention.

Figure 2D:
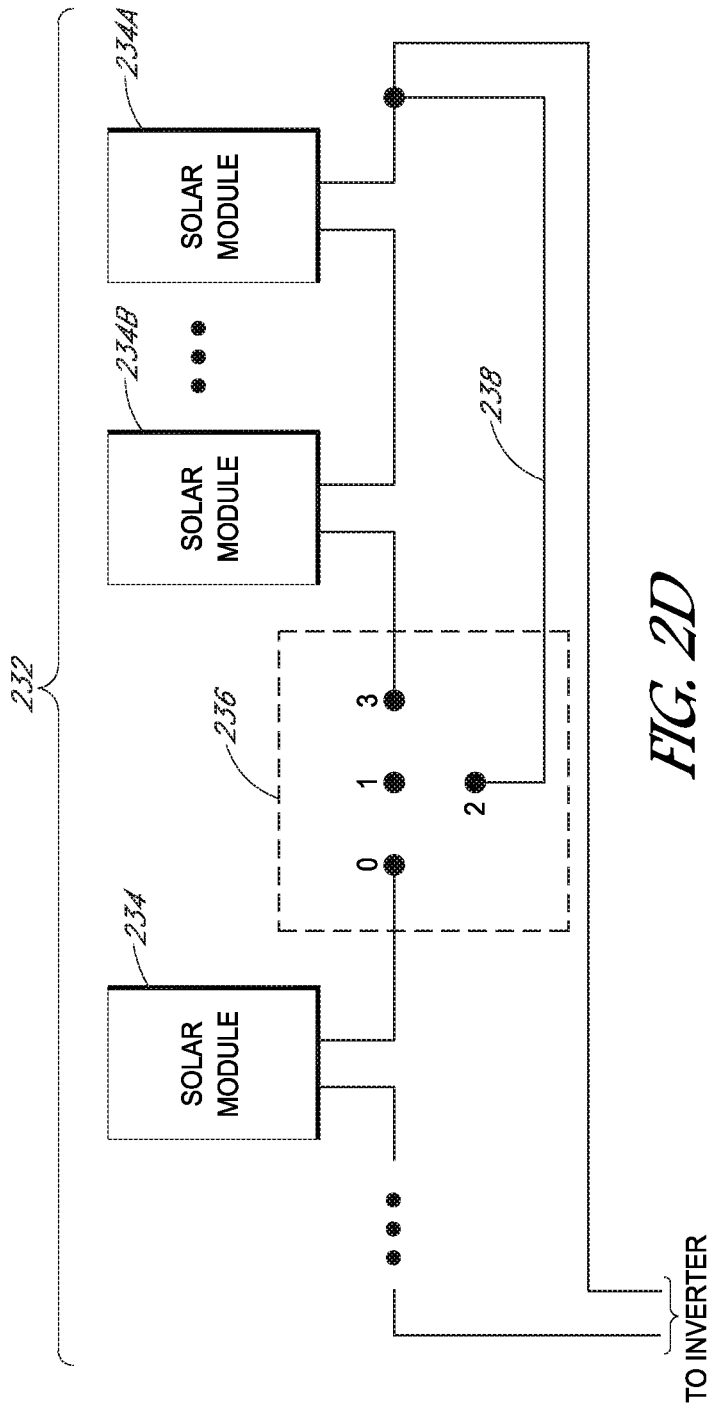
FIG. 2D illustrates a portion of a solar system with a system-level device for electrically decoupling a solar module or modules from a string of a plurality of solar modules during an open circuit configuration, in accordance with an embodiment of the present invention.

Referring to FIG. 2A, a portion of a solar system 200 includes a string 202 of a plurality of solar modules 204 (including 204A and 204B). A device may be included for electrically decoupling a solar module from the string 202 of the plurality of solar modules during an open circuit configuration (not shown in FIG. 2A, but shown in and described in association with FIGS. 2B-2E below). Shown in FIG. 2A are modules 204A and 204B and pathways 206 and 208 indicating possible locations where a device may be used to bypass one or more modules under open circuit conditions, as described in more detail below.

In an embodiment, the device includes switching circuitry configured to remove one or more solar modules from the string of the plurality of solar modules during the open circuit configuration in response to a measured string current or voltage. For example, FIG. 2B illustrates an exemplary arrangement of points 210 where current may be measured and decoupling/coupling may take place, in accordance with an embodiment of the present invention. Referring to FIG. 2B, in open circuit conditions, points 1 and 2 must be connected. This arrangement bypasses the module 204A. In non-open circuit conditions, points 1 and 3, and points 2 and 4, must be connected. This arrangement brings the module 204A into the string circuit. In one embodiment, in order to implement the arrangement of points 210, a measure of string current and a means to control switches is included, such as a computerized controller as described in association with FIG. 3. In a specific such embodiment, a normally closed switch (to allow connecting points 1 and 2) and two normally open switches (to allow connecting points 1 and 3 as well as 2 and 4) are included.

Thus, referring to FIG. 2C, in one embodiment, the switching circuitry includes a relay 220 having a normally closed contact and two normally open contacts. The numbers (0, 1, 2, 3, 4) associated with relay 220 correspond with the connecting points described in association with FIG. 2B. When current is not flowing in the string (open circuit), the normally closed contact is active, and bypasses the module. When current begins flowing in the string, the relay opens the normally closed contact and closes the normally open contacts. The bypass connection is opened as a result, bringing the module into series with the rest of the modules in the string. When string current ceases to flow, the relay returns to its normal position, with the module bypassed. In one embodiment, the point at which the relay switches states is tuned so that it only switches the module into the circuit when there is enough current to draw the string voltage down to the point where it is below the voltage rating of the system. In a specific embodiment, a device including such switching circuitry is integrated in a junction box of a module of the string of modules. In another specific embodiment, a device including such switching circuitry is included as an in-line unit that is used on one or two modules in a string. In another specific embodiment, the device is housed in a module detachable from the solar system.

In an embodiment, referring again to FIG. 2A, the device is associated with module 204A and, in an open circuit configuration, is used to bypass module 204A via pathway 206. In another embodiment, however, the string 202 of the plurality of solar modules includes N solar modules, and one or more devices is used for electrically decoupling the solar module 204A and an additional one to N−2 solar modules from the string 202 of the plurality of solar modules during the open circuit configuration. For example, referring again to FIG. 2A, one or more devices is associated with modules 204A and 204B and, in an open circuit configuration, is used to bypass modules 204A and 204B via pathway 208.

In another aspect, a device to decouple one or more modules may be included at the system level, as opposed to at the module level as described in association with FIGS. 2A-2C. As an example, FIG. 2D illustrates a portion of a solar system with a system-level device for electrically decoupling a solar module from a string of a plurality of solar modules during an open circuit configuration, in accordance with an embodiment of the present invention.

Referring to FIG. 2D, a portion of a solar system 230 includes a string 232 of a plurality of solar modules 234 (including 234A and 234B). A device 236 is included for electrically decoupling one or more solar modules from the string 232 of the plurality of solar modules during an open circuit configuration. Any number of solar modules may be bypassed with a single relay in this case. For example, in one embodiment, modules 234A and 234B are bypassed with device 236 during open circuit conditions. In an embodiment, at least a portion of a device suitable for electrically decoupling one or more solar modules from the string 232 is included in an external cable 238 coupled with the string 232 of the plurality of solar modules, as depicted in FIG. 2D.

Figure 2E:
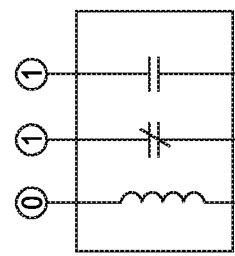
FIG. 2E illustrates a relay having a normally closed contact and a normally open contact, in accordance with an embodiment of the present invention.

As an example of a suitable device 236, FIG. 2E illustrates a relay 240 having a normally closed contact and a normally open contact, in accordance with an embodiment of the present invention. In open circuit conditions, points 1 and 2 of 236 must be connected. This arrangement bypasses the series of modules (e.g., modules 234A and 234B) and provides a short to the input of the inverter through an external cable. In non-open circuit conditions, points 1 and 3 must be connected, which brings the series of modules back into the string circuit. Thus, in an embodiment, only two switches are required, namely, a normally closed switch (to connect points 1 and 2) and a normally open switch (to connect points 1 and 3). When current is not flowing in the string (open circuit), the normally closed contact is active and bypasses the series of modules. When current begins flowing in the string, the relay opens the normally closed contact and closes the normally open contact. The resulting arrangement connects the remainder of the string.

Alternatively, in an embodiment, electrically decoupling a solar module from a string of a plurality of solar modules during an open circuit configuration is performed with a single pole double throw (SPDT) type relay, which necessitates only a single switch. Compared to the description above, such an embodiment requires a bypass cable and an additional enclosure to house the relay and cable splices. In yet another embodiment, a device for electrically decoupling a solar module is or includes a controller with greater sophistication than a relay coil. Such an embodiment may be implemented by replacing a control function of a relay with a line powered microcomputer and a string current measurement. In another embodiment, a solid state relay is instead used to perform the electrical decoupling, eliminating a need for mechanical components and reducing switching time.

In an aspect of the present invention, a device for electrically decoupling one or more solar modules from a string of a plurality of solar modules during an open circuit configuration is provided. For example, the devices described in association with FIGS. 2A-2E may be provided as isolable devices and may be attachable/detachable to and from a solar system. In an embodiment, a device for electrically decoupling one or more solar modules from a string of a plurality of solar modules includes switching circuitry configured to remove one of the solar modules from the string of the plurality of solar modules during the open circuit configuration in response to a measured string current or voltage.

In one embodiment, the switching circuitry includes a relay having a normally closed contact and two normally open contacts, as described in association with FIG. 2C. In one embodiment, the device is adaptable for inclusion in a junction box of the one of the solar modules of the string of the plurality of solar modules. In one embodiment, the device is housed in a module detachable from the string of the plurality of solar modules.

It is to be understood that a measurement of whether a solar system is in or near an open circuit condition may be based on either a voltage measurement or a current measurement. In an embodiment, there are many ways to perform such a measurement, such as but not limited to, relay coils (e.g., for measuring current), zener diodes (e.g., for measuring voltage), or microcomputers which connect to circuits that measure current and/or voltage.

Furthermore, especially with respect to open circuit determination, embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with a solar system. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 3:
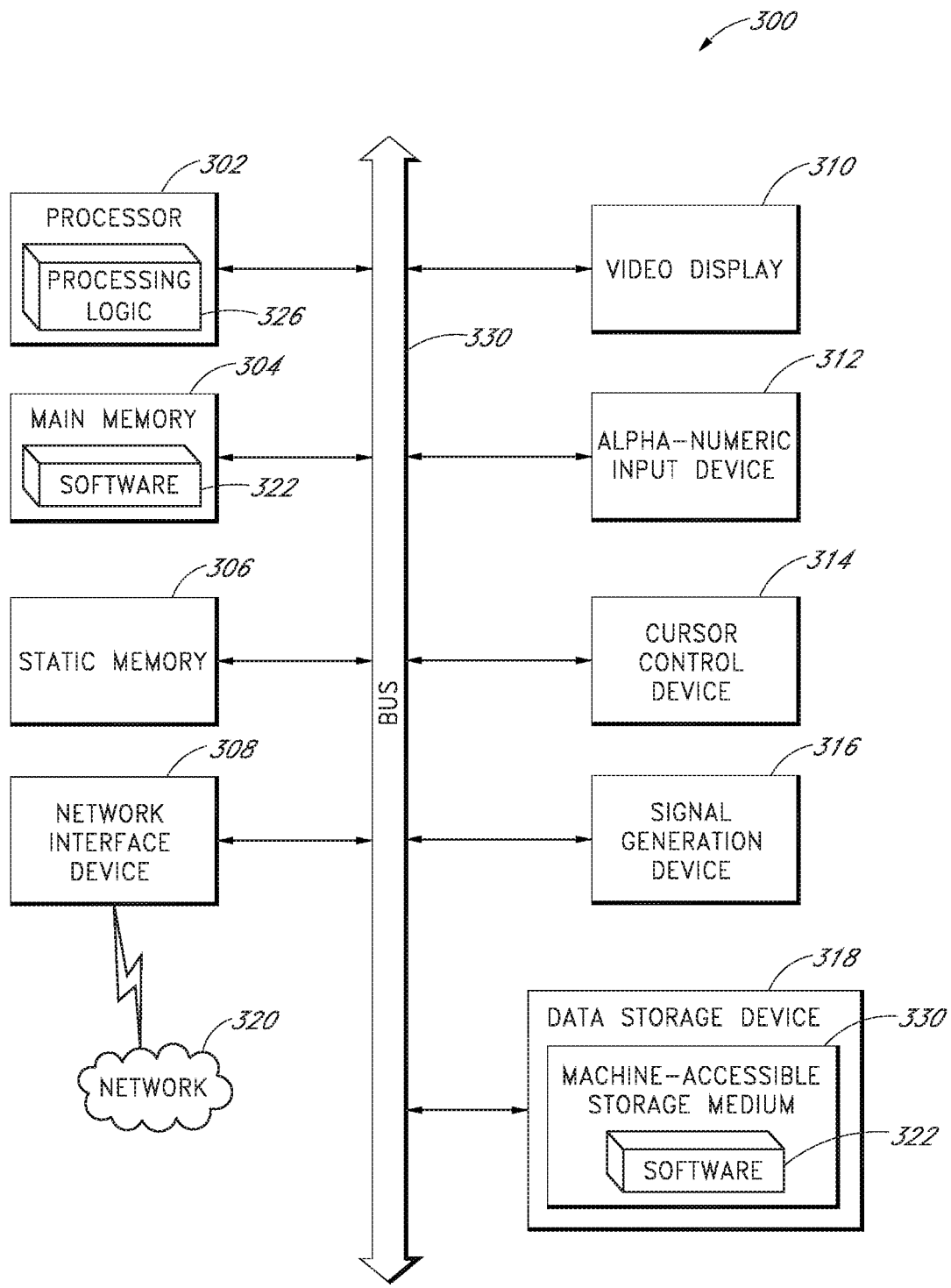
FIG. 3 illustrates a block diagram of an exemplary computer system, in accordance with an embodiment of the present invention.

FIG. 3 illustrates a diagrammatic representation of a machine in the exemplary form of a computer system 300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 300 includes a processor 302, a main memory 304 (e.g., read-only memory (ROM), flash memory, dynamic random access memory (DRAM) such as synchronous DRAM (SDRAM) or Rambus DRAM (RDRAM), etc.), a static memory 306 (e.g., flash memory, static random access memory (SRAM), etc.), and a secondary memory 318 (e.g., a data storage device), which communicate with each other via a bus 330.

Processor 302 represents one or more general-purpose processing devices such as a microprocessor, central processing unit, or the like. More particularly, the processor 302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 302 may also be one or more special-purpose processing devices such as an application specific integrated circuit (ASIC), a field programmable gate array (FPGA), a digital signal processor (DSP), network processor, or the like. Processor 302 is configured to execute the processing logic 326 for performing the operations described herein.

The computer system 300 may further include a network interface device 308. The computer system 300 also may include a video display unit 310 (e.g., a liquid crystal display (LCD), a light emitting diode display (LED), or a cathode ray tube (CRT)), an alphanumeric input device 312 (e.g., a keyboard), a cursor control device 314 (e.g., a mouse), and a signal generation device 316 (e.g., a speaker).

The secondary memory 318 may include a machine-accessible storage medium (or more specifically a computer-readable storage medium) 331 on which is stored one or more sets of instructions (e.g., software 322) embodying any one or more of the methodologies or functions described herein. The software 322 may also reside, completely or at least partially, within the main memory 304 and/or within the processor 302 during execution thereof by the computer system 300, the main memory 304 and the processor 302 also constituting machine-readable storage media. The software 322 may further be transmitted or received over a network 320 via the network interface device 308.

While the machine-accessible storage medium 331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, devices for reducing the open circuit voltages of solar systems have been disclosed. In accordance with an embodiment of the present invention, a solar system includes a string of a plurality of solar modules having an open circuit voltage. The solar system also includes a device for reducing the open circuit voltage of the string of the plurality of solar modules during an open circuit configuration. In one embodiment, the device is a current shunting device. In another embodiment, the device is for electrically decoupling a solar module from the string of the plurality of solar modules during the open circuit configuration.

What is claimed is:

1. A solar module system coupled to a system load, the solar module system comprising:
   a string of a plurality of solar modules electrically coupled in series, wherein the string is configured to provide power to the system load, wherein the string has a string open circuit voltage when the string is not providing power to the system load and an operating voltage when the string is providing power to the system load; and
   a module decoupling device including a controller, a voltage measurement device, and a system relay that is coupled across two or more solar modules of the string, wherein the controller is configured to control the system relay to change from a first configuration for electrically coupling the two or more solar modules to the string to a second configuration for electrically decoupling the two or more solar modules from the string, when the voltage measurement device measures a predetermined voltage at an arrangement of points within the system relay, such that the string has a reduced open circuit voltage below the string open circuit voltage.

2. The solar module system of claim 1, wherein the reduced open circuit voltage is between the string open circuit voltage and the operating voltage.

3. The solar module system of claim 1, wherein the reduced open circuit voltage is below the operating voltage.

4. The solar module system of claim 1, further comprising a second module decoupling device coupled across at least one solar module of the string, wherein the controller is configured to control a system relay to selectively decouple the at least one solar module from the string.

5. The solar module system of claim 4, wherein the predetermined voltage is the open circuit voltage of the string, and wherein the at least one solar module is selectively decoupled from the string when the string is not providing power to the system load.

6. The solar module system of claim 1, wherein the module decoupling device is housed in a module detachable from the string of the plurality of solar modules.

7. The solar module system of claim 1, wherein the two or more solar modules are electrically recoupled to the string when there is sufficient current to draw the string voltage below a voltage rating of the solar module system.

8. The solar of module system of claim 1, wherein the system relay comprises a normally closed switch and a normally open switch.

9. The solar of module system of claim 7, wherein during open circuit conditions the normally open switch is open and the normally closed switch is closed.

10. The solar of module system of claim 1, wherein the module decoupling device is an in-line unit in the string.

11. The solar of module system of claim 1, wherein at least a portion of the system relay is included in an external cable coupled with the string.

12. The solar of module system of claim 1, further comprising an inverter coupled to the string.

\* \* \* \* \*